US012803591B2

(12) United States Patent
Kim et al.

(10) Patent No.: US 12,803,591 B2
(45) Date of Patent: Nov. 17, 2026

(54) METHOD AND APPARATUS FOR DECODING NON-BINARY LOW-DENSITY PARITY-CHECK CODE IN COMMUNICATION SYSTEM

(71) Applicant: ELECTRONICS AND TELECOMMUNICATIONS RESEARCH INSTITUTE, Daejeon (KR)

(72) Inventors: Seokki Kim, Daejeon (KR); Nam Il Kim, Daejeon (KR); Youngjoo Lee, Pohang-si (KR); Jeongwon Choe, Pohang-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 63 days.

(21) Appl. No.: 18/953,762

(22) Filed: Nov. 20, 2024

(65) Prior Publication Data

US 2026/0025151 A1 Jan. 22, 2026

(30) Foreign Application Priority Data

Nov. 20, 2023 (KR) ........................ 10-2023-0160589

(51) Int. Cl.
*H03M 13/11* (2006.01)

(52) U.S. Cl.
CPC ............................... *H03M 13/1105* (2013.01)

(58) Field of Classification Search
None
See application file for complete search history.

(56) References Cited

U.S. PATENT DOCUMENTS

| | | | |
|---|---|---|---|
| 10,205,468 | B2 | 2/2019 | Ahn et al. |
| 10,554,226 | B2 | 2/2020 | Boutillon et al. |
| 10,879,935 | B2 | 12/2020 | Kim |
| 11,290,128 | B2 | 3/2022 | Marchand et al. |

(Continued)

FOREIGN PATENT DOCUMENTS

| | | | |
|---|---|---|---|
| EP | 3419179 | A1 | 12/2018 |
| KR | 10-2015-0118318 | A | 10/2015 |

(Continued)

OTHER PUBLICATIONS

Reduced-complexity check node processing for non-binary LDPC decoding, Xinmiao Zhang and Fang Cai (Year: 2010).*

(Continued)

*Primary Examiner* — Guerrier Merant
(74) *Attorney, Agent, or Firm* — Rabin & Berdo, P.C.

(57) ABSTRACT

A method of a first communication node may comprise: storing a compressed channel message in an APP memory, based on a signal received from a second communication node; generating a first V2C message using a first APP message and a first C2V message respectively obtained from the APP memory and a C2V memory, in a VNP process; obtaining a first minimum vector and a second minimum vector by performing CW sorting on the first V2C message, in a CNP process; performing normalization on the first V2C message based on the first minimum vector, in the CNP process; and obtaining a third minimum vector by performing RW sorting on the second minimum vector based on the first minimum vector, in the CNP process.

14 Claims, 17 Drawing Sheets

(56) References Cited

U.S. PATENT DOCUMENTS

| | | | |
|---|---|---|---|
| 2018/0138924 | A1 | 5/2018 | Kim et al. |
| 2018/0358983 | A1 | 12/2018 | Kim et al. |

FOREIGN PATENT DOCUMENTS

| | | | |
|---|---|---|---|
| WO | 2019/068053 | A1 | 4/2019 |
| WO | 2022/102843 | A1 | 5/2022 |

OTHER PUBLICATIONS

One-minimum-only basic-set trellis min-max decoding algorithm, The Cuong Dinh, Huyen Pham Thi, Hung Dao Tuan, Nghia Pham Xuan (Year: 2021).*

* cited by examiner

100

400

500

1500

METHOD AND APPARATUS FOR DECODING NON-BINARY LOW-DENSITY PARITY-CHECK CODE IN COMMUNICATION SYSTEM

CROSS-REFERENCE TO RELATED APPLICATIONS

This application claims priority to Korean Patent Application No. 10-2023-0160589, filed on Nov. 20, 2023, with the Korean Intellectual Property Office (KIPO), the entire contents of which are hereby incorporated by reference.

BACKGROUND

1. Technical Field

The present disclosure relates to a technique for decoding a low-density parity-check (LDPC) code, and more particularly, to a technique for decoding a non-binary LDPC code.

2. Related Art

A communication network (e.g. 5G communication network or 6G communication network) is being developed to provide enhanced communication services compared to the existing communication networks (e.g. long term evolution (LTE), LTE-Advanced (LTE-A), etc.). The 5G communication network (e.g. New Radio (NR) communication network) can support frequency bands both below 6 GHz and above 6 GHz. In other words, the 5G communication network can support both a FR1 and/or FR2 band. Compared to the LTE communication network, the 5G communication network can support various communication services and scenarios.

The 6G communication network can support a variety of communication services and scenarios compared to the 5G communication network. The 6G communication network can meet the requirements of hyper-performance, hyper-bandwidth, hyper-space, hyper-precision, hyper-intelligence, and/or hyper-reliability. The 6G communication network can support diverse and wide frequency bands and can be applied to various usage scenarios such as terrestrial communication, non-terrestrial communication, sidelink communication, and the like.

Recently, wireless communication technologies require high-capacity packet transmission, low latency, and high reliability. However, packet errors caused by channel noise and other interferences degrade the overall capacity of the communication system. The 3rd Generation Partnership Project (3GPP) has specified low-density parity-check (LDPC) codes as a channel coding scheme for shared channels in 5G communication systems, considering their characteristics of high throughput, low latency, low decoding complexity, and support for various coding rates. The selection of LDPC codes is due to LDPC codes' superior performance at high code rates required for high-speed data transmission and their capability for parallel processing in hardware implementation of decoding algorithms.

The LDPC codes can achieve excellent performance near a channel capacity when using decoding algorithms based on iterative decoding. In particular, non-binary (NB) LDPC codes offer advantages over binary LDPC codes in terms of channel capacity under various channel conditions and modulation schemes, and they exhibit superior performance, especially for a codeword with a short length. However, NB-LDPC codes have higher decoding complexity compared to binary LDPC codes. To utilize NB-LDPC codes effectively, decoding algorithms with reduced complexity are required.

SUMMARY

The present disclosure for addressing the above-described problems is directed to providing a method and an apparatus for efficiently decoding a non-binary LDPC code.

A method of a first communication node, according to exemplary embodiments of the present disclosure for achieving the above-described objective, may comprise: storing a compressed channel message in an a posteriori probability (APP) memory, based on a signal received from a second communication node; generating a first variable-to-check (V2C) message using a first APP message and a first check-to-variable (C2V) message respectively obtained from the APP memory and a C2V memory, in a variable node processing (VNP) process; obtaining a first minimum vector and a second minimum vector by performing column-wise (CW) sorting on the first V2C message, in a check node processing (CNP) process; generating a second V2C message by performing normalization on the first V2C message based on the first minimum vector, in the CNP process; obtaining a third minimum vector by performing row-wise (RW) sorting on the second minimum vector based on the first minimum vector, in the CNP process; generating a second C2V message based on the third minimum vector, in the CNP process; and performing an APP update based on the second V2C message and the second C2V message, in an APP update process.

Lengths of the first minimum vector and the second minimum vector may be a degree of a check node, a length of the third minimum vector may be smaller than the degree of the check node, the channel message may be an element belonging to a Galois field (GF) whose order is q, which is a nonbinary finite field, the channel message may correspond to a vector of length q, q may be a natural number greater than or equal to 2, each of the first APP message, the first C2V message, and the first V2C message may correspond to a vector of length $q_e$, and $q_e$ may be a natural number smaller than q.

The VNP process, the CNP process, and the APP update process may be iteratively performed until non-binary (NB)-low density parity check (LDPC) decoding is completed.

The obtaining of the third minimum vector may comprise: performing normalization and normal-to-delta conversion on the second minimum vector based on the first minimum vector; and performing the RW sorting on the converted second minimum vector to obtain the third minimum vector.

The generating of the second C2V message may comprise: obtaining intrinsic information and extrinsic information based on the third minimum vector; and performing recovery for the second C2V message using the intrinsic information and the extrinsic information, wherein the intrinsic information and the extrinsic information may be stored in the C2V memory.

The VNP process may comprise: obtaining intrinsic information and extrinsic information from the C2V memory; generating the first C2V message based on the intrinsic information and the extrinsic information; obtaining the first APP message from the APP memory; and generating the first V2C message by performing a subtraction operation on the first C2V message and the first APP message.

The APP update process may comprise: generating a second APP message based on the second V2C message and the second CV2 message; compressing the second APP message; and storing the compressed second APP message in the APP memory.

A first communication node, according to exemplary embodiments of the present disclosure for achieving the above-described objective, may comprise: at least one processor, wherein the at least one processor causes the first communication node to perform: storing a compressed channel message in an a posteriori probability (APP) memory, based on a signal received from a second communication node; generating a first variable-to-check (V2C) message using a first APP message and a first check-to-variable (C2V) message respectively obtained from the APP memory and a C2V memory, in a variable node processing (VNP) process; obtaining a first minimum vector and a second minimum vector by performing column-wise (CW) sorting on the first V2C message, in a check node processing (CNP) process; generating a second V2C message by performing normalization on the first V2C message based on the first minimum vector, in the CNP process; obtaining a third minimum vector by performing row-wise (RW) sorting on the second minimum vector based on the first minimum vector, in the CNP process; generating a second C2V message based on the third minimum vector, in the CNP process; and performing an APP update based on the second V2C message and the second C2V message, in an APP update process.

Lengths of the first minimum vector and the second minimum vector may be a degree of a check node, a length of the third minimum vector may be smaller than the degree of the check node, the channel message may be an element belonging to a Galois field (GF) whose order is q, which is a nonbinary finite field, the channel message may correspond to a vector of length q, q may be a natural number greater than or equal to 2, each of the first APP message, the first C2V message, and the first V2C message may correspond to a vector of length $q_e$, and $q_e$ may be a natural number smaller than q.

The VNP process, the CNP process, and the APP update process may be iteratively performed until non-binary (NB)-low density parity check (LDPC) decoding is completed.

In the obtaining of the third minimum vector, the at least one processor may cause the first communication node to perform: performing normalization and normal-to-delta conversion on the second minimum vector based on the first minimum vector; and performing the RW sorting on the converted second minimum vector to obtain the third minimum vector.

In the generating of the second C2V message, the at least one processor may cause the first communication node to perform: obtaining intrinsic information and extrinsic information based on the third minimum vector; and performing recovery for the second C2V message using the intrinsic information and the extrinsic information, wherein the intrinsic information and the extrinsic information may be stored in the C2V memory.

In the VNP process, the at least one processor may cause the first communication node to perform: obtaining intrinsic information and extrinsic information from the C2V memory; generating the first C2V message based on the intrinsic information and the extrinsic information; obtaining the first APP message from the APP memory; and generating the first V2C message by performing a subtraction operation on the first C2V message and the first APP message.

In the APP update process, the at least one processor may cause the first communication node to perform: generating a second APP message based on the second V2C message and the second CV2 message; compressing the second APP message; and storing the compressed second APP message in the APP memory.

According to the present disclosure, the CW-TMM algorithm can reduce the complexity of sorters in the TMM decoder for NB-LDPC codes. The CW-TMM algorithm can also reduce memory usage and overall decoding complexity through a message compression technique. When a 6-stage pipelined structure is applied to the CW-TMM algorithm, the NB-LDPC decoding throughput can be increased, and hardware complexity can be reduced.

Furthermore, when the length of NB-LDPC codes increases, the issue of decreased memory efficiency can be addressed.

DETAILED DESCRIPTION OF THE EMBODIMENTS

Figure 1:
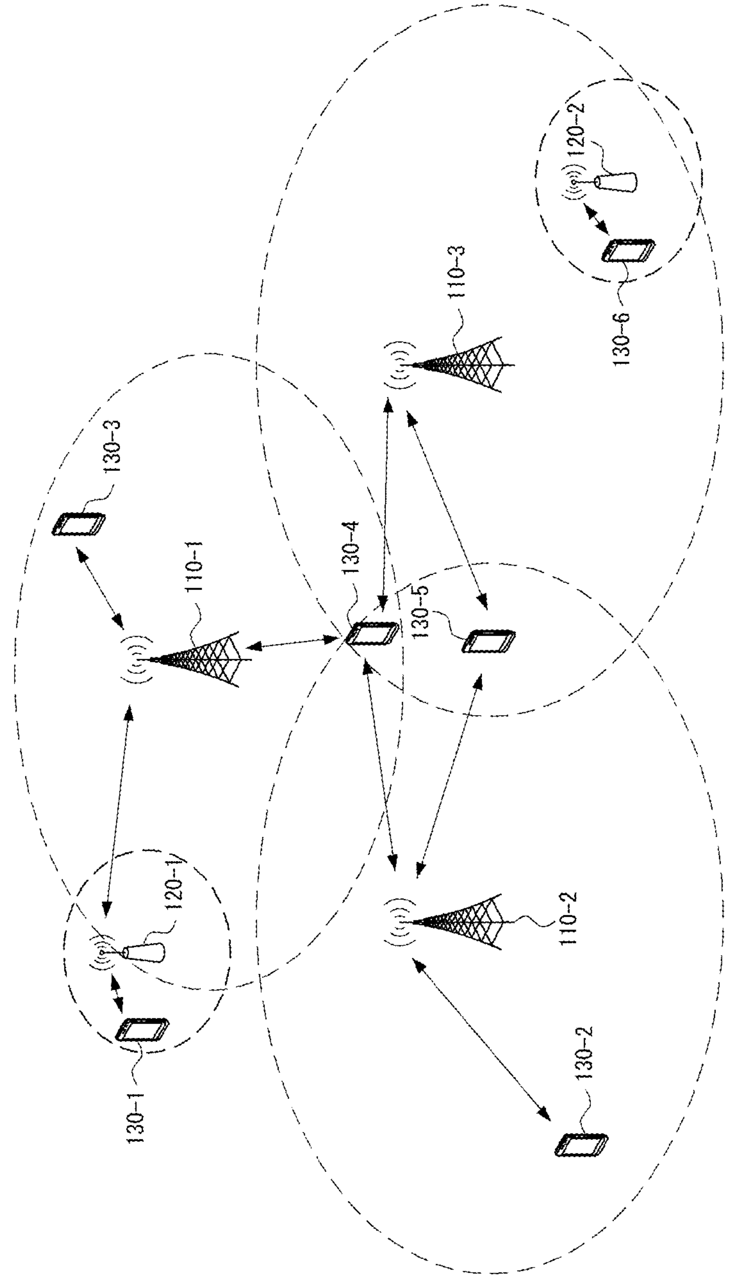
FIG. 1 is a conceptual diagram illustrating an exemplary embodiment of a communication system.

While the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A communication system to which exemplary embodiments according to the present disclosure are applied will be described. The communication system to which the exemplary embodiments according to the present disclosure are applied is not limited to the contents described below, and the exemplary embodiments according to the present disclosure may be applied to various communication systems. Here, the communication system may have the same meaning as a communication network.

Throughout the present disclosure, a network may include, for example, a wireless Internet such as wireless fidelity (WiFi), mobile Internet such as a wireless broadband Internet (WiBro) or a world interoperability for microwave access (WiMax), 2G mobile communication network such as a global system for mobile communication (GSM) or a code division multiple access (CDMA), 3G mobile communication network such as a wideband code division multiple access (WCDMA) or a CDMA2000, 3.5G mobile communication network such as a high speed downlink packet access (HSDPA) or a high speed uplink packet access (HSUPA), 4G mobile communication network such as a long term evolution (LTE) network or an LTE-Advanced network, 5G mobile communication network, beyond 5G (B5G) mobile communication network (e.g. 6G mobile communication network), or the like.

Throughout the present disclosure, a terminal may refer to a mobile station, mobile terminal, subscriber station, portable subscriber station, user equipment, access terminal, or the like, and may include all or a part of functions of the terminal, mobile station, mobile terminal, subscriber station, mobile subscriber station, user equipment, access terminal, or the like.

Here, a desktop computer, laptop computer, tablet PC, wireless phone, mobile phone, smart phone, smart watch, smart glass, e-book reader, portable multimedia player (PMP), portable game console, navigation device, digital camera, digital multimedia broadcasting (DMB) player, digital audio recorder, digital audio player, digital picture recorder, digital picture player, digital video recorder, digital video player, or the like having communication capability may be used as the terminal.

Throughout the present specification, the base station may refer to an access point, radio access station, node B (NB), evolved node B (eNB), base transceiver station, mobile multihop relay (MMR)-BS, or the like, and may include all or part of functions of the base station, access point, radio access station, NB, eNB, base transceiver station, MMR-BS, or the like.

Hereinafter, preferred exemplary embodiments of the present disclosure will be described in more detail with reference to the accompanying drawings. In describing the present disclosure, in order to facilitate an overall understanding, the same reference numerals are used for the same elements in the drawings, and duplicate descriptions for the same elements are omitted.

FIG. 1 is a conceptual diagram illustrating an exemplary embodiment of a communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. The plurality of communication nodes may support 4G communication (e.g. long term evolution (LTE), LTE-advanced (LTE-A)), 5G communication (e.g. new radio (NR)), 6G communication (e.g. enhanced version of NR), etc. specified in the 3rd generation partnership project (3GPP) standards. The 4G communication may be performed infrequency bands below 6 GHz, and the 5G communication may be performed in frequency bands above 6 GHz as well as frequency bands below 6 GHz. The 6G communication can enable data transmission at 1 Tbps in a terahertz band and integrate terrestrial and non-terrestrial communication.

For example, in order to perform the 4G communication, 5G communication, and 6G communication, the plurality of communication may support a code division multiple access (CDMA) based communication protocol, wideband CDMA (WCDMA) based communication protocol, time division multiple access (TDMA) based communication protocol, frequency division multiple access (FDMA) based communication protocol, orthogonal frequency division multiplexing (OFDM) based communication protocol, filtered OFDM based communication protocol, cyclic prefix OFDM (CP-OFDM) based communication protocol, discrete Fourier transform spread OFDM (DFT-s-OFDM) based communication protocol, orthogonal frequency division multiple access (OFDMA) based communication protocol, single carrier FDMA (SC-FDMA) based communication protocol, non-orthogonal multiple access (NOMA) based communication protocol, generalized frequency division multiplexing (GFDM) based communication protocol, filter bank multi-carrier (FBMC) based communication protocol, universal filtered multi-carrier (UFMC) based communication protocol, space division multiple access (SDMA) based communication protocol, orthogonal time-frequency space (OTFS) based communication protocol, or the like.

Further, the communication system 100 may further include a core network. When the communication 100 supports 4G communication, the core network may include a serving gateway (S-GW), packet data network (PDN) gateway (P-GW), mobility management entity (MME), and the like. When the communication system 100 supports 5G communication or 6G communication, the core network may include a user plane function (UPF), session management function (SMF), access and mobility management function (AMF), and the like.

Meanwhile, each of the plurality of communication nodes 110-1, 110-2, 110-3, 120-1, 120-2, 130-1, 130-2, 130-3, 130-4, 130-5, and 130-6 constituting the communication system 100 may have the following structure.

Figure 2:
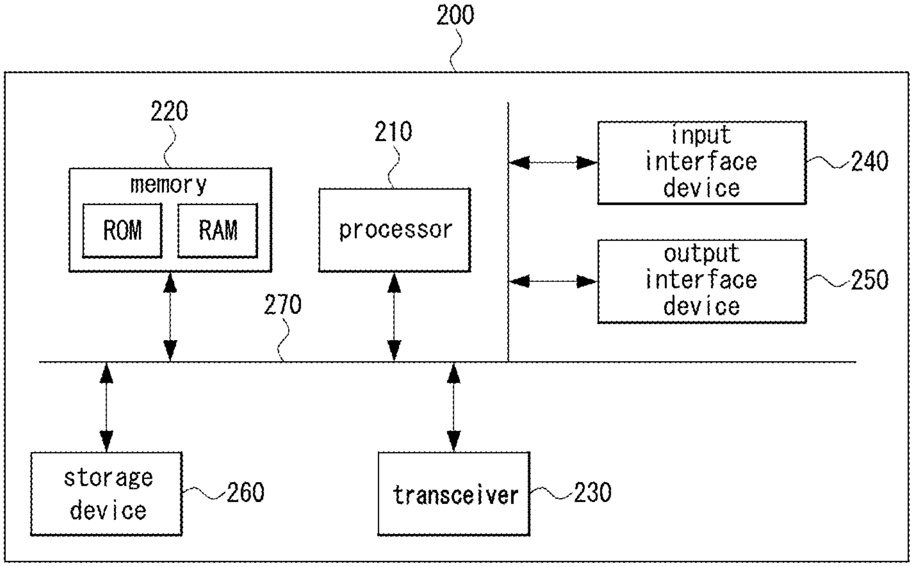
FIG. 2 is a block diagram illustrating an exemplary embodiment of a communication node constituting a communication system.

FIG. 2 is a block diagram illustrating an exemplary embodiment of a communication node constituting a communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270.

However, each component included in the communication node 200 may not be connected to the common bus 270 but may be connected to the processor 210 via an individual interface or a separate bus. For example, the processor 210 may be connected to at least one of the memory 220, the transceiver 230, the input interface device 240, the output interface device 250 and the storage device 260 via a dedicated interface.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring again to FIG. 1, the communication system 100 may comprise a plurality of base stations 110-1, 110-2, 110-3, 120-1, and 120-2, and a plurality of terminals 130-1, 130-2, 130-3, 130-4, 130-5, and 130-6. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to cell coverage of the first base station 110-1. Also, the second terminal 130-2, the fourth terminal 130-4, and the fifth terminal 130-5 may belong to cell coverage of the second base station 110-2. Also, the fifth base station 120-2, the fourth terminal 130-4, the fifth terminal 130-5, and the sixth terminal 130-6 may belong to cell coverage of the third base station 110-3. Also, the first terminal 130-1 may belong to cell coverage of the fourth base station 120-1, and the sixth terminal 130-6 may belong to cell coverage of the fifth base station 120-2.

Here, each of the plurality of base stations 110-1, 110-2, 110-3, 120-1, and 120-2 may refer to a Node-B (NB), evolved Node-B (eNB), gNB, base transceiver station (BTS), radio base station, radio transceiver, access point, access node, road side unit (RSU), radio remote head (RRH), transmission point (TP), transmission and reception point (TRP), or the like.

Each of the plurality of terminals 130-1, 130-2, 130-3, 130-4, 130-5, and 130-6 may refer to a user equipment (UE), terminal, access terminal, mobile terminal, station, subscriber station, mobile station, portable subscriber station, node, device, Internet of Thing (IoT) device, mounted module/device/terminal, on-board device/terminal, or the like.

Meanwhile, each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul or a non-ideal backhaul, and exchange information with each other via the ideal or non-ideal backhaul. Also, each of the plurality of base stations 110-1, 110-2, 110-3, 120-1, and 120-2 may be connected to the core network through the ideal or non-ideal backhaul. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

In addition, each of the plurality of base stations 110-1, 110-2, 110-3, 120-1, and 120-2 may support multi-input multi-output (MIMO) transmission (e.g. a single-user MIMO (SU-MIMO), multi-user MIMO (MU-MIMO), massive MIMO, or the like), coordinated multipoint (CoMP) transmission, carrier aggregation (CA) transmission, transmission in an unlicensed band, device-to-device (D2D)

communications (or, proximity services (ProSe)), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2, and operations supported by the plurality of base stations 110-1, 110-2, 110-3, 120-1, and 120-2. For example, the second base station 110-2 may transmit a signal to the fourth terminal 130-4 in the SU-MIMO manner, and the fourth terminal 130-4 may receive the signal from the second base station 110-2 in the SU-MIMO manner.

Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner.

The first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

Hereinafter, methods for configuring and managing radio interfaces in a communication system will be described. Even when a method (e.g. transmission or reception of a signal) performed at a first communication node among communication nodes is described, the corresponding second communication node may perform a method (e.g. reception or transmission of the signal) corresponding to the method performed at the first communication node. That is, when an operation of a terminal is described, a corresponding base station may perform an operation corresponding to the operation of the terminal. Conversely, when an operation of a base station is described, a corresponding terminal may perform an operation corresponding to the operation of the base station.

Meanwhile, in a communication system, a base station may perform all functions (e.g. remote radio transmission/reception function, baseband processing function, and the like) of a communication protocol. Alternatively, the remote radio transmission/reception function among all the functions of the communication protocol may be performed by a transmission and reception point (TRP) (e.g. flexible (f)-TRP), and the baseband processing function among all the functions of the communication protocol may be performed by a baseband unit (BBU) block. The TRP may be a remote radio head (RRH), radio unit (RU), transmission point (TP), or the like. The BBU block may include at least one BBU or at least one digital unit (DU). The BBU block may be referred to as a 'BBU pool', 'centralized BBU', or the like. The TRP may be connected to the BBU block through a wired fronthaul link or a wireless fronthaul link. The communication system composed of backhaul links and fronthaul links may be as follows. When a functional split scheme of the communication protocol is applied, the TRP may selectively perform some functions of the BBU or some functions of medium access control (MAC)/radio link control (RLC) layers.

The present disclosure will describe an algorithm and hardware structure for efficiently decoding a non-binary low-density parity-check (NB-LDPC) code, one of error correction codes used in data communication systems, through hardware implementation. The present disclosure can be applied to various system models involving error correction codes, including not only communication systems but also emerging storages, broadcasting systems, and the like.

Figure 3:
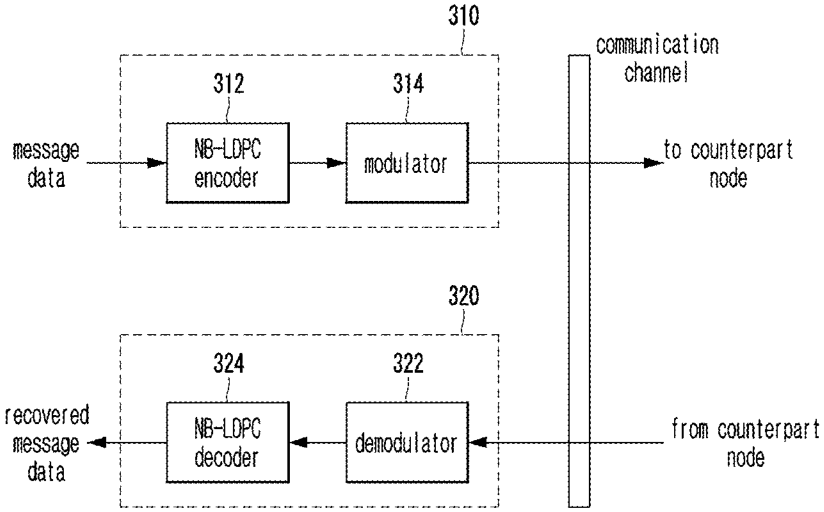
FIG. 3 is a functional block diagram of a communication node for describing functions of the communication node according to exemplary embodiments of the present disclosure.

In a communication system, NB-LDPC encoding and decoding between communication nodes may be performed as shown in FIG. 3.

FIG. 3 is a functional block diagram of a communication node for describing functions of the communication node according to exemplary embodiments of the present disclosure.

Referring to FIG. 3, a communication node may include a data transmission unit 310 and a data reception unit 320. The communication node may be a base station or a terminal, and this is merely for convenience of description without being limited thereto.

The data transmission unit 310 may include an NB-LDPC encoder 312 and a modulator 314. The NB-LDPC encoder 312 may encode message data to be transmitted to a counterpart node (e.g. terminal) as an NB-LDPC code, and output an encoded codeword. The modulator 314 may modulate the codeword to generate modulated symbols. The modulated symbols may be transmitted to the counterpart node through a communication channel. For example, the NB-LDPC encoder 312 may be implemented by program instructions executed by the processor 210 shown in FIG. 2.

The data reception unit 320 may include a demodulator 322 and an NB-LDPC decoder 324. The demodulator 322 may receive modulated symbols transmitted from a counterpart node through the communication channel, demodulate them, and output demodulated symbols. The NB-LDPC decoder 324 may receive the demodulated symbols and perform NB-LDPC decoding to output recovered message data. The NB-LDPC decoder 324 may perform decoding operations iteratively for a preset number of iterations. The NB-LDPC decoder 324 may also be implemented by program instructions executed by the processor 210 shown in FIG. 2.

The NB-LDPC code is an extension of a binary LDPC code to a higher Galois field (GF) order, offering superior error correction performance. The NB-LDPC code may be defined by a sparse parity check matrix (PCM). In the PCM, each row may correspond to a check node (CN), and each column may correspond to a variable node (VN).

Decoding of the NB-LDPC code may proceed through message passing between CNs and VNs. When layered scheduling is applied, decoding of the NB-LDPC code may be divided into three stages: variable-node processing (VNP), check-node processing (CNP), and a posteriori probability (APP) update. The VNP and APP update may be processed through element-wise subtraction or addition of incoming messages. In the case of CNP, the computational complexity may be relatively high. One efficient method for CNP is a trellis min-max (TMM) algorithm. The TMM algorithm can output messages all at once, providing advantages in terms of latency.

While the TMM algorithm has the advantage of outputting messages at once, the CNP involves use of multiple sorters, which may increase complexity. In systems such as 5G communication systems or storage systems, where the length of NB-LDPC code becomes longer, memory usage increases, reducing hardware efficiency.

The present disclosure will describe a column-wise TMM (CW-TMM) algorithm, which reduces the complexity of sorters in a TMM decoder for the NB-LDPC code. By applying a message compression technique to a trellis-based decoder, the present disclosure can reduce memory usage and overall decoding complexity. A decoding throughput can be increased by adopting a 6-stage pipelined structure for the designed decoder. Hardware complexity can be reduced by optimizing redundant parts at a submodule level. According to the present disclosure, memory usage can be reduced by approximately 54%, and decoder complexity can be reduced by approximately 63% compared to the conventional techniques. It can be observed that the present disclosure can maintain excellent error correction performance. In describing the CW-TMM algorithm, the NB-LDPC code may be assumed to be defined for GF(q).

Figure 4:
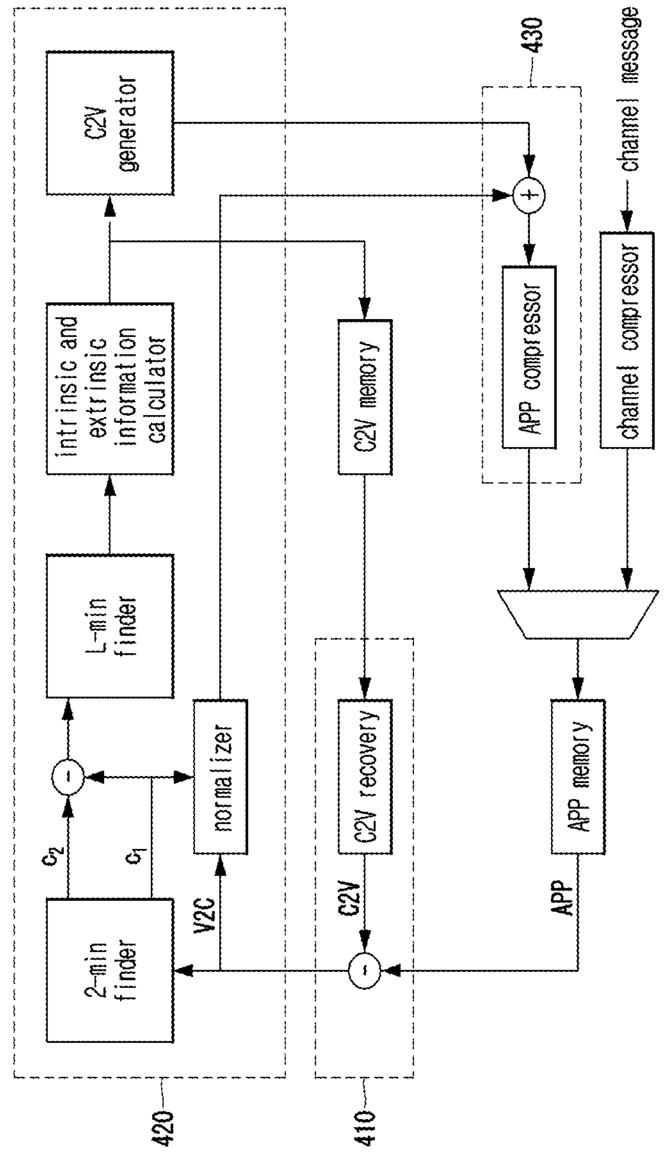
FIG. 4 is a block diagram illustrating a structure of a column-wise trellis min-max (CW-TMM) decoder according to exemplary embodiments of the present disclosure.

FIG. 4 is a block diagram illustrating a structure of a column-wise trellis min-max (CW-TMM) decoder according to exemplary embodiments of the present disclosure.

Referring to FIG. 4, a CW-TMM decoder 400 may perform variable-node processing (VNP) 410, check-node processing (CNP) 420, and APP update 430. When a channel message is input to the CW-TMM decoder 400 through a channel, the channel message may be compressed in a channel compressor according to a message compression technique and stored in an APP memory. Decoding may proceed by iteratively performing the VNP 410, CNP 420, and APP update 430 for a preset maximum number of iterations. The CW-TMM decoder 400 may further include a decision unit. When decoding is performed up to the maximum number of iterations, the decision unit may generate a decoded output based on APP results stored in the APP memory. In FIG. 4, the CNP 420 may be implemented using the CW-TMM algorithm to reduce complexity. As the compressed message is stored in the APP memory, memory usage may be reduced. The channel message may be assumed to be an element belonging to a non-binary finite field GF(q) and represented as a vector of length q.

The VNP 410 may perform subtraction on C2V message(s) and APP message(s) to generate V2C message(s). The VNP 410 may obtain intrinsic and extrinsic information from a C2V memory. The VNP 410 may perform recovery on the obtained intrinsic and extrinsic information to generate recovered C2V message(s). Additionally, the VNP 410 may obtain APP message(s) from the APP memory, which may include compressed channel message(s) and compressed APP message(s).

Each of the APP message(s), recovered C2V message(s), and V2C message(s) may correspond to a vector of length $q_e$. Here, $q_e$ may be smaller than q (i.e. $q_e<q$). As described earlier, q may represent the order of GF and may be a natural number greater than or equal to 2.

The CNP 420 may include a 2-min finder, an L-min finder, an intrinsic and extrinsic information calculator, a C2V generator, and a normalizer. The 2-min finder may identify two minimum values from the V2C messages generated by the VNP 410. The L-min finder may identify L minimum values based on the two minimum values identified by the 2-min finder. The intrinsic and extrinsic information calculator may calculate intrinsic and extrinsic information using the L minimum values identified by the L-min finder.

The 2-min finder may use $d_c$ V2C messages as input and perform CW sorting to output the first minimum value $c_1$ and the second minimum value $c_2$. Each of the $d_c$ V2C messages may be represented as a vector of length $q_e$. The two minimum values $c_1$ and $c_2$ may each be represented as a vector of length $d_c$. Here, $q_e$ may be smaller than q (i.e. $q_e<q$), and q may represent the order of GF, which is a natural number greater than or equal to 2. dc may represent a degree of the check node (CN).

The L-min finder may use a vector of length $d_c$ as input and generate a vector of length L as output. The vector of length L may be a subset of the vector of length $d_c$, including L minimum values. L may be preconfigured (or predefined) as a value smaller than $d_c$.

The normalizer may generate (or obtain) normalized V2C message(s) by using the first minimum value $c_1$ output from the 2-min finder for the V2C message(s) generated in the VNP 410. In the normalizer, subtraction operations between the V2C message(s) and the first minimum value $c_1$ may be performed. The subtraction operation may refer to a vector subtraction operation.

The intrinsic and extrinsic information calculated in the CNP 420 may be stored in the C2V memory. The C2V generator may generate C2V message(s) using the calculated intrinsic and extrinsic information. The normalizer may perform normalization on the V2C message(s) generated in the VNP 410 to generate normalized V2C message(s). The intrinsic and extrinsic information stored in the C2V memory may be accessed by the VNP 410 in the next iteration and used to recover C2V message(s). The C2V message(s) recovered by the VNP 410 may refer to the C2V message(s) used in the previous iteration. The C2V message(s) generated through the C2V generator may correspond to vectors of length q.

The APP update 430 may perform addition operations between the V2C message(s) forwarded from the VNP 410 to the CNP 420 and the C2V message(s) generated in the CNP 420 to obtain APP result(s). The APP update 430 may include an APP compressor. The APP compressor in the APP update 430 may generate compressed APP message(s) from the APP result(s). The compressed APP message(s) may be stored in the APP memory. The addition operation may refer to a vector addition operation. The compressed APP message(s) may correspond to vectors of length $q_e$.

The APP memory may be located externally to the APP update 430. This is provided merely for convenience of description without being limited thereto. In other words, the APP update 430 may include the APP memory.

As shown in FIG. 4, the CW-TMM algorithm may omit the RW operations in a trellis graph. In the CW-TMM algorithm, only the CW operations may be performed in the trellis graph.

In FIG. 4, for convenience of description, a single CW-TMM decoder is illustrated for decoding (or decoding) of the NB-LDPC code (or coding), but the present disclosure is not limited thereto. In other words, decoding (or decoding) of the NB-LDPC code (or coding) may be performed in parallel using multiple CW-TMM decoders.

The channel compressor may perform compression on channel message(s) to generate compressed channel message(s). As described earlier, the channel message(s) may correspond to vectors of length q. The compressed channel message(s) may correspond to vectors of length $q_e$.

The CW-TMM decoder may adopt a 6-stage pipelined technique. A timing diagram for applying the 6-stage pipelined technique may be illustrated in FIG. 5.

Figure 5:
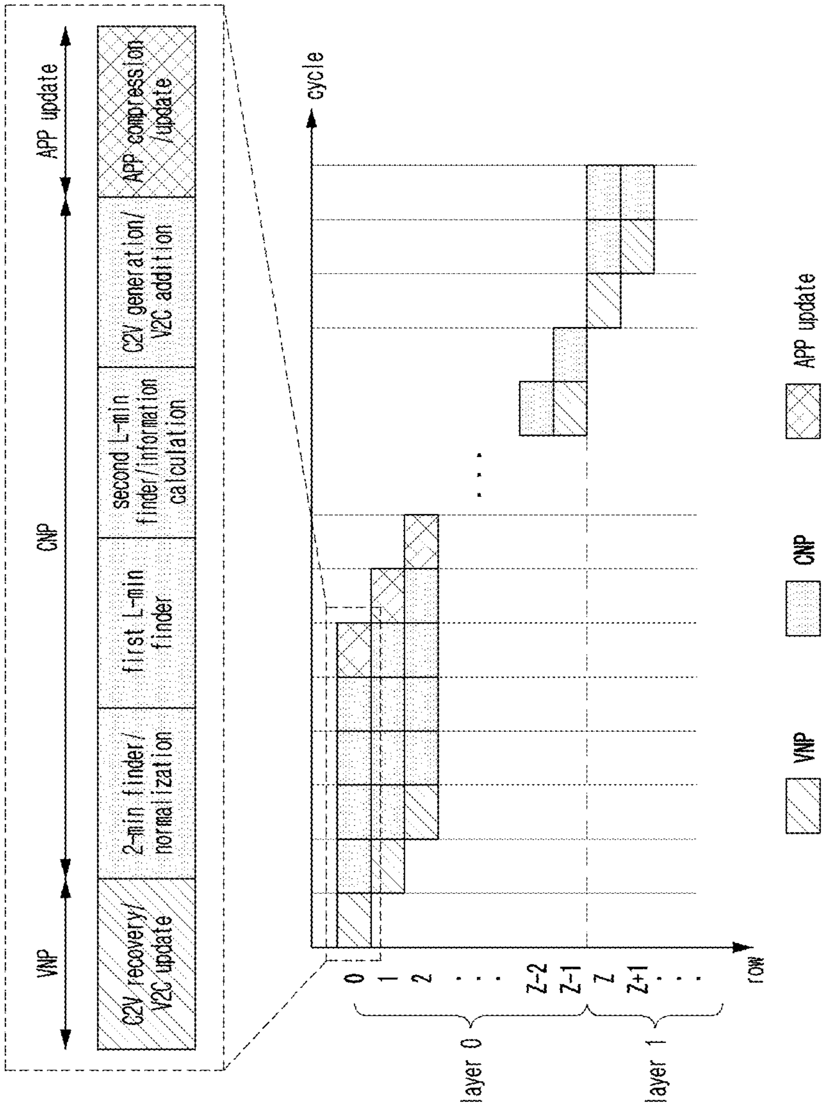
FIG. 5 is a timing diagram illustrating a pipelined technique applied to a column-wise trellis min-max decoder according to exemplary embodiments of the present disclosure.

FIG. 5 is a timing diagram illustrating a pipelined technique applied to a column-wise trellis min-max decoder according to exemplary embodiments of the present disclosure.

Referring to FIG. 5, a 6-stage pipelined technique 600 may be divided into a VNP process, a CNP process, and an APP update process. The 6-stage pipelined technique 600 may include a C2V recovery/V2C update stage, a 2-min finder/normalization stage, a first L-min finder stage, a second L-min finder/information calculation stage, a C2V generation/V2C addition stage, and an APP compression/update stage. The VNP process may include the C2V recovery/V2C update stage. The CNP process may include the 2-min finder/normalization stage, the first L-min finder stage, the second L-min finder/information calculation stage, and the C2V generation/V2C addition stage. The APP update process may include the APP compression/update stage. The information calculated during the second L-min finder/information calculation stage may refer to intrinsic and extrinsic information.

When the 6-stage pipelined technique 600 is applied to the CW-TMM decoder, the CW-TMM decoder may use layered scheduling to output messages corresponding to the respective rows of the PCM from the APP memory and the C2V memory in every cycle. The VNP, CNP, and APP update processes may take 1, 4, and 1 cycles, respectively, for a total of 6 cycles. This allows the decoder's operating frequency to be increased, improving decoding throughput.

As shown in FIG. 4, the CW-TMM decoder may include the channel compressor. The complexity of the channel compressor may be reduced, as illustrated in FIG. 6.

Figure 6:
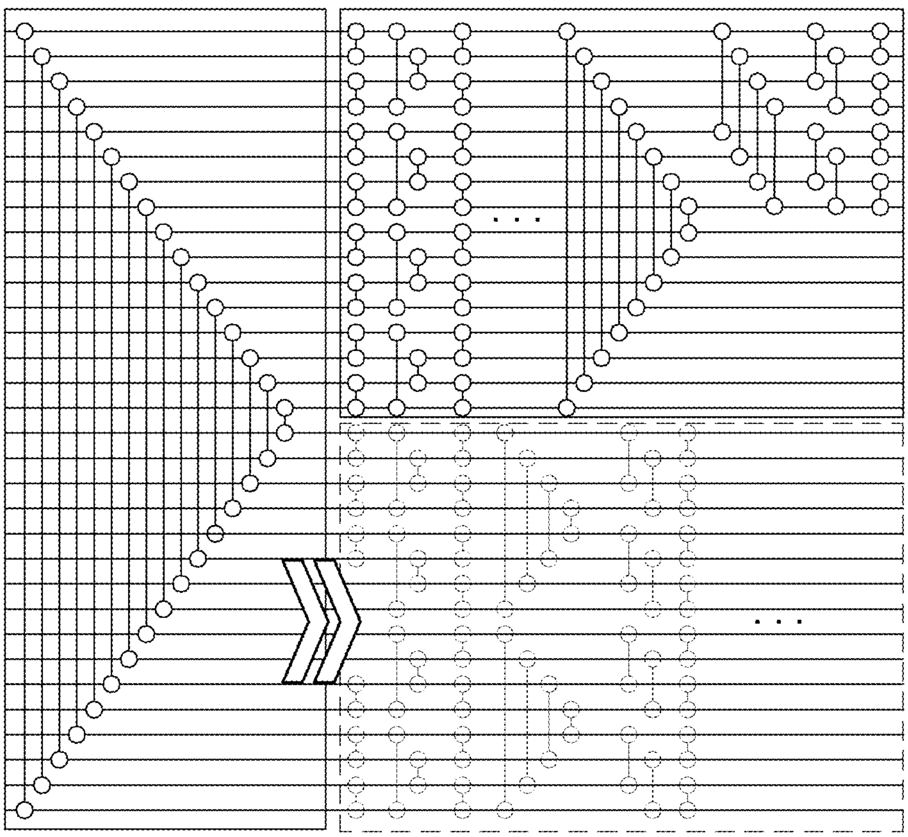
FIG. 6 is a conceptual diagram illustrating reduction in complexity of a channel compressor in a column-wise trellis min-max decoder according to exemplary embodiments of the present disclosure.

FIG. 6 is a conceptual diagram illustrating reduction in complexity of a channel compressor in a column-wise trellis min-max decoder according to exemplary embodiments of the present disclosure.

Referring to FIG. 6, a channel compressor 600 may take q inputs and output $q_e$ minimum values. A 2-to-1 compress step performed by the channel compressor 600 may serve to reduce output candidates to q/2 by comparing the inputs that are the farthest apart on a constellation map. As a result, the number of compare-and-swap (CAS) units may be reduced by 62%.

As shown in FIG. 4, the CW-TMM decoder may include the C2V generator. A structure of the C2V generator included in the CW-TMM decoder may be illustrated in FIG. 7.

Figure 7:
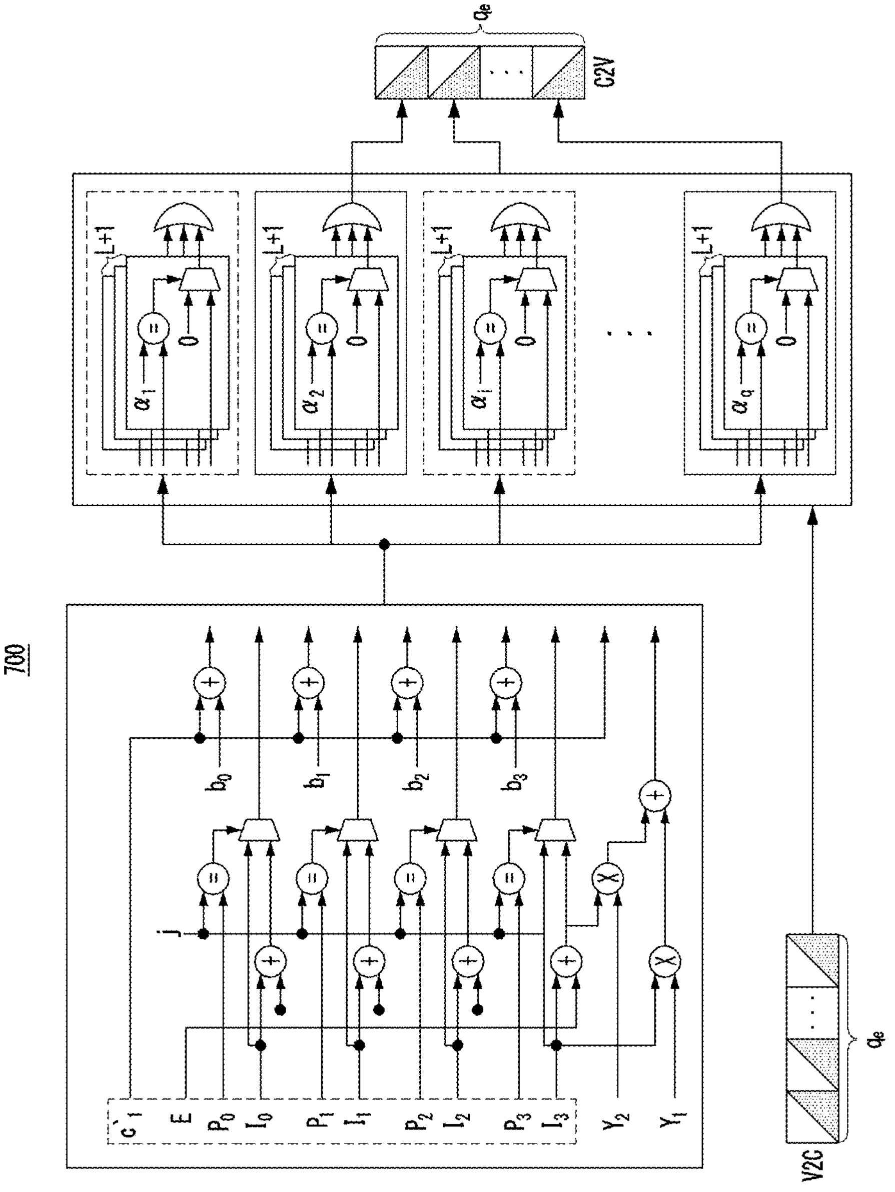
FIG. 7 is a block diagram illustrating a structure of a C2V generator according to exemplary embodiments of the present disclosure.

FIG. 7 is a block diagram illustrating a structure of a C2V generator according to exemplary embodiments of the present disclosure.

Referring to FIG. 7, a C2V generator 700 may perform a function of expanding intrinsic and extrinsic information generated in the CNP into a check-to-variable (C2V) message. In the conventional TMM decoder, generating a C2V message of length q may require q expansion units. In the CW-TMM decoder, applying the message compression technique may allow the generation of C2V message of length $q_e$. Accordingly, the number of expansion units may be reduced by a factor of $q_e/q$ compared to the conventional structure.

Next, operations performed in the CW-TMM decoder will be described. In the CW-TMM decoder, the VNP process, CNP process, and APP update process may be performed iteratively as illustrated in FIG. 8.

Figure 8:
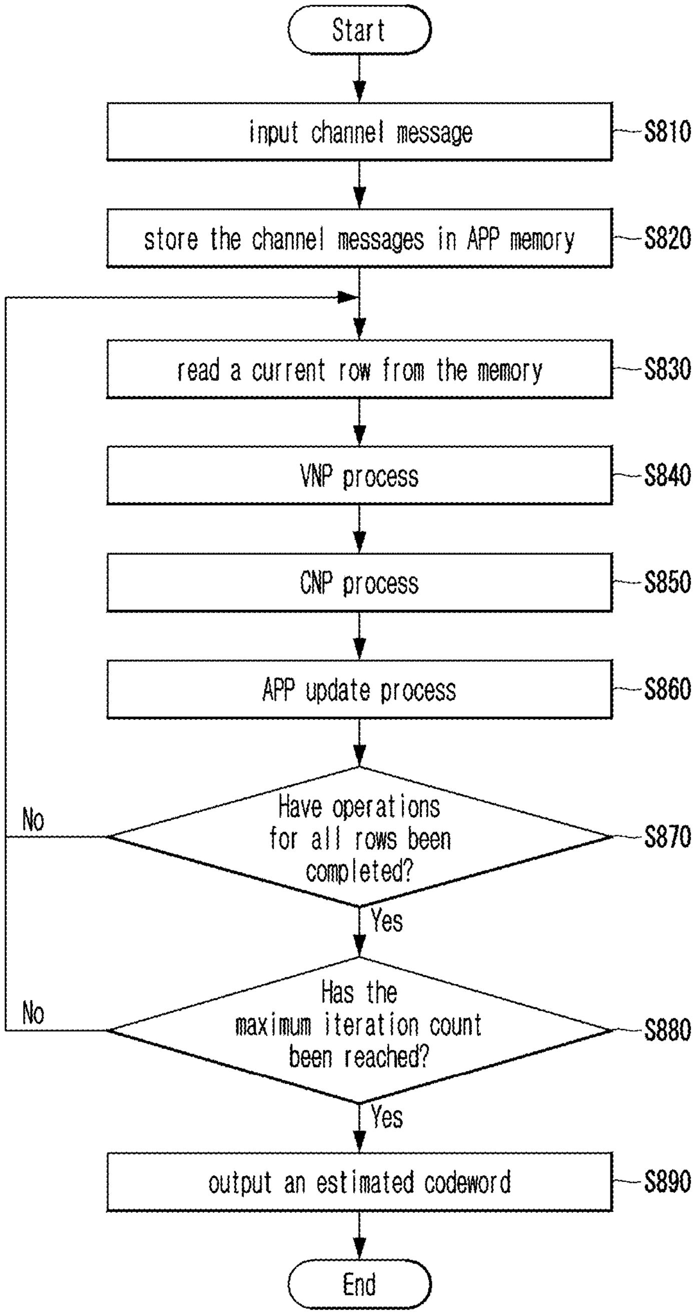
FIG. 8 is a flowchart illustrating operations of a CW-TMM decoder according to exemplary embodiments of the present disclosure.

FIG. 8 is a flowchart illustrating operations of a CW-TMM decoder according to exemplary embodiments of the present disclosure.

Referring to FIG. 8, the CW-TMM decoder may use channel messages as input. In the CW-TMM decoder, the channel messages may be compressed and stored in the APP memory. Subsequently, the CW-TMM decoder may perform the VNP process, CNP process, and APP update process for each row. When the CW-TMM decoder completes operations for all rows, one iteration may be considered complete. The VNP process, CNP process, and APP update process in the CW-TMM decoder may be iterated up to the maximum iteration count. After completing the VNP process, CNP process, and APP update process for the maximum iteration count, the CW-TMM decoder may output a decoded codeword and complete the NB-LDPC decoding operation. The CW-TMM decoder may be assumed to be in an initialized state. In FIG. 8, similar or redundant descriptions from FIGS. 3 to 7 may be omitted for brevity.

Referring again to FIG. 8, the communication system may include a first communication node and a second communication node. The first communication node may be a terminal (or base station), and the second communication node may be the base station (or terminal). If the first communication node is a terminal, the first communication node may receive a channel message from the second communication node through a downlink.

Conversely, the second communication node may receive a channel message from the first communication node through an uplink. If the first communication node is a receiving terminal and the second communication node is a transmitting terminal, the first communication node may receive a channel message from the second communication node through a sidelink. The first and second communication nodes may be configured identically or similarly to the communication node shown in FIG. 2.

In step S810, the channel message may be input to the CW-TMM decoder. The channel message may include demodulated samples obtained after demodulating a signal received over a channel between the first communication node and the second communication node. In other words, the channel message may refer to NB-LDPC-encoded data.

In step S820, the CW-TMM decoder may perform compression on the channel message input in step S810 and store the compressed channel message in the APP memory.

The CW-TMM decoder may perform steps S830 through S860 to perform the VNP process, CNP process, and APP update process for the current row.

In steps S830 to S860, the CW-TMM decoder may perform read operations on the APP memory and the C2V memory for the current row to obtain multiple C2V messages and multiple APP messages (S830). The CW-TMM decoder may perform the VNP process based on the obtained multiple C2V messages and APP messages to generate V2C messages (S840). The CW-TMM decoder may perform the CNP process based on the generated V2C messages to generate normalized V2C messages, intrinsic and extrinsic information, and multiple C2V messages. The CW-TMN decoder may store the calculated intrinsic and extrinsic information in the C2V memory (S850). The CW-TMM decoder may perform addition operations on the normalized V2C messages and the C2V messages to obtain APP results. The CW-TMN decoder may compress the APP results to generate compressed APP messages and store the compressed APP messages in the APP memory (S860).

In step S870, the CW-TMM decoder may determine whether operations for all rows have been completed. If the CW-TMN decoder determines that operations for all rows have not been completed, the CW-TMM decoder may perform steps S830 through S860 for the current row. If the CW-TMN decoder determines that operations for all rows have been completed, the CW-TMM decoder may proceed to step S890.

In step S880, the CW-TMM decoder may determine whether the maximum iteration count has been reached. If the CW-TMN decoder determines that the maximum iteration count has not been reached, the CW-TMM decoder may update (or configure) the current row to the next row and perform steps S830 through S860. If the CW-TMM decoder determines that the maximum iteration count has been reached, the CW-TMN decoder may proceed to step S890.

In step S890, the CW-TMM decoder may output an estimated codeword and terminate the NB-LDPC decoding process.

Although steps S810 to S890 of the CW-TMM decoder's operation process have been described individually, this does not restrict the order in which the steps are performed. If necessary, the steps may be performed simultaneously, performed in a different order, or combined.

Next, the CNP process performed in the CW-TMM decoder will be described. The CNP process may be represented as shown in FIG. 9.

Figure 9:
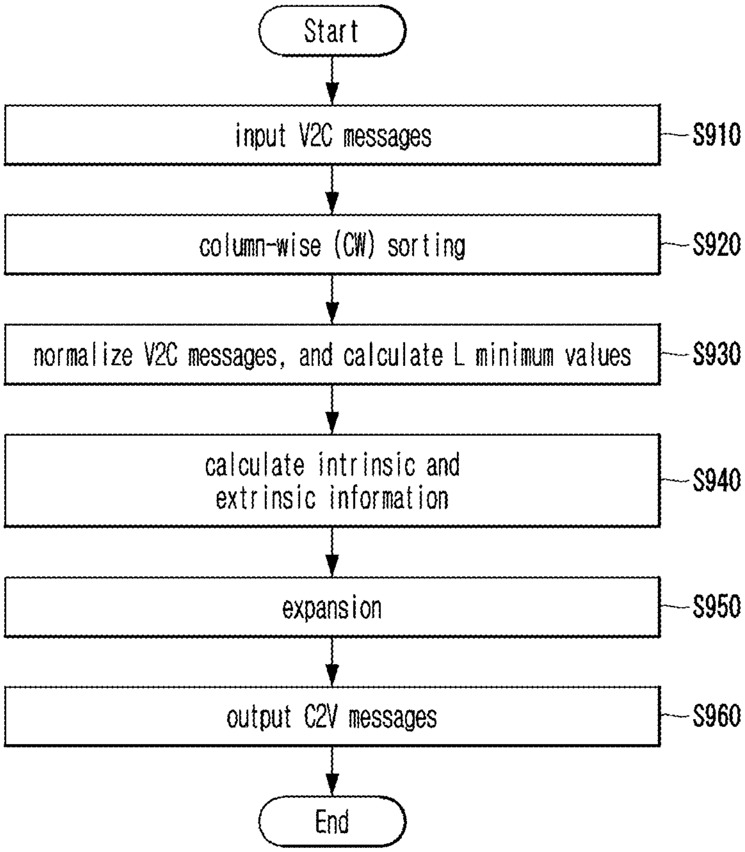
FIG. 9 is a flowchart illustrating a CNP process of a CW-TMM decoder according to exemplary embodiments of the present disclosure.

FIG. 9 is a flowchart illustrating a CNP process of a CW-TMM decoder according to exemplary embodiments of the present disclosure.

Referring to FIG. 9, in the CNP process of the CW-TMM decoder, variable-to-check (V2C) messages may be used as input. When V2C messages are input, compressed data may be generated through a column-wise (CW) sorter. The first minimum value in the compressed data may be used to normalize the V2C messages. The second minimum value in the compressed data may be input to the L-minima sorter. Subsequently, the L minimum values may be used to calculate intrinsic and extrinsic information, and the L minimum values may be expanded to output C2V message(s). In describing the CNP process of the CW-TMM decoder in FIG. 9, similar or redundant descriptions from FIGS. 3 to 8 may be omitted for brevity.

In step S910, V2C message(s) may be input into the CNP process. The V2C message(s) may be generated by performing the VNP process S840 of the CW-TMM decoder shown in FIG. 8. The CNP process corresponds to the CNP process S830 of the CW-TMM decoder shown in FIG. 8.

In step S920, the CNP process may perform CW sorting on the V2C message(s) input in step S910 to generate compressed data. Then, step S930 of the CNP process may be performed.

In step S930, the CNP process may use the first minimum value from the compressed data generated in step S920 to normalize the input V2C message(s). The CNP process may further use the second minimum value from the compressed data as input to the L-minima sorter to calculate (or generate) L minimum values. Then, step S940 of the CNP process may be performed.

In step S940, the CNP process may calculate (or generate) intrinsic and extrinsic information based on the normalized V2C messages and the calculated (or generated) L minimum values in step S930. Then, step S950 of the CNP process may be performed.

In steps S950 and S960, the CNP process may perform expansion of the intrinsic and extrinsic information calculated (or generated) in step S940 (S950) and output C2V message(s) (S960).

In the above-described operations of the CW-TMM decoder, steps S910 to S960 have been described individually, but this does not restrict the order in which the steps are performed. If necessary, the steps may be performed simultaneously, performed in a different order, or combined.

Next, the conventional TMM algorithm for NB-LDPC decoding will be compared with the CW-TMM algorithm. The conventional TMM algorithm may be represented as shown in FIGS. 10A and 10B, while the CW-TMM algorithm may be represented as shown in FIGS. 11A and 11B.

Figure 10A:
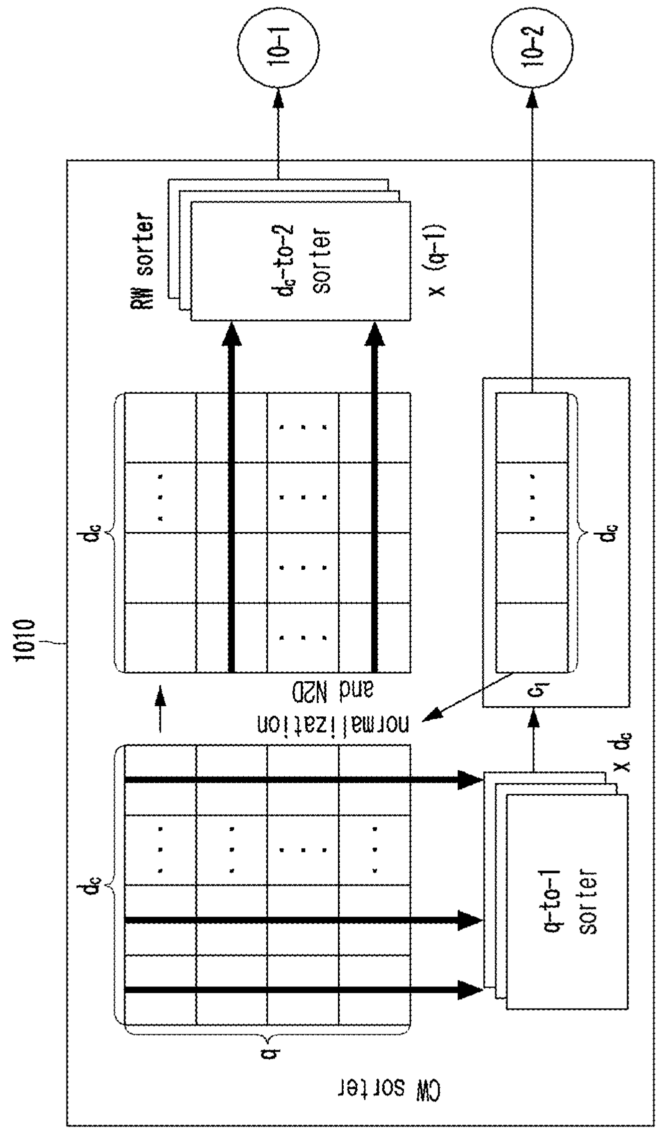
FIG. 10A is a conceptual diagram illustrating a first part of the conventional TMM algorithm to describe the conventional TMM algorithm according to exemplary embodiments of the present disclosure.
Figure 10B:
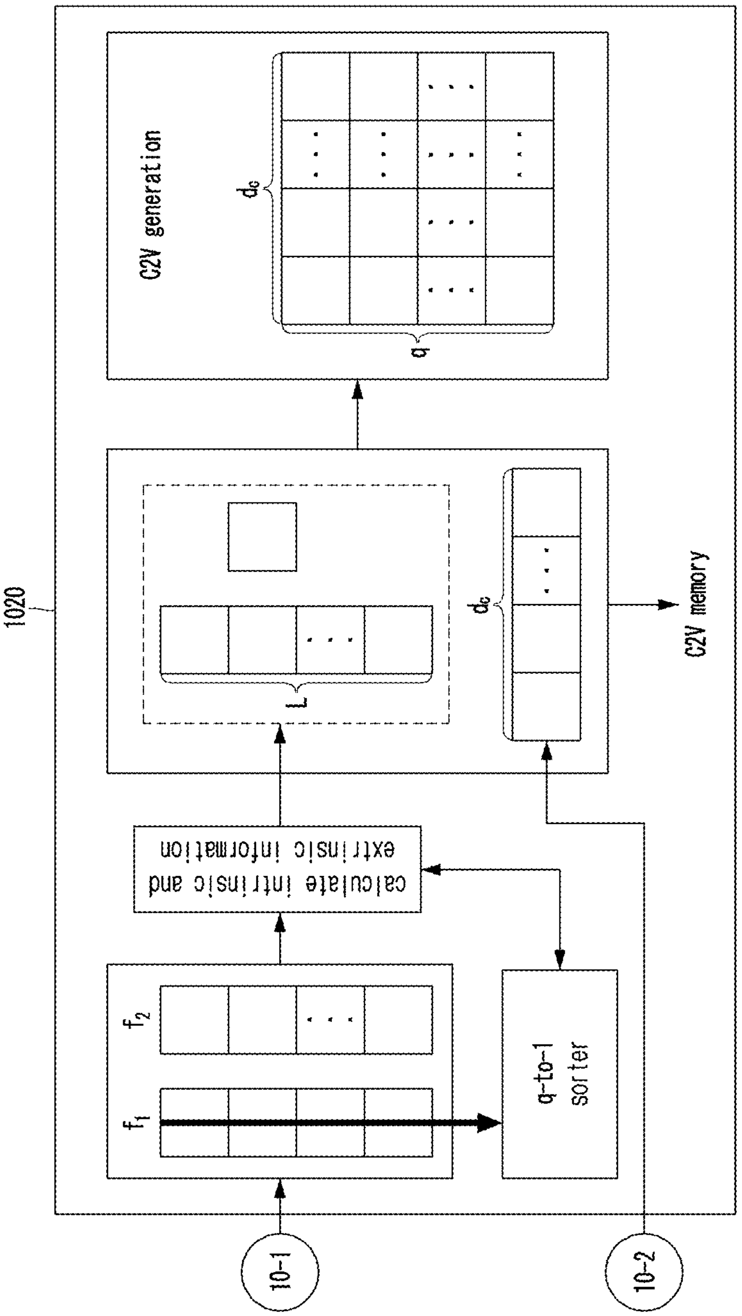
FIG. 10B is a conceptual diagram illustrating a second part of the conventional TMM algorithm to describe the conventional TMM algorithm according to exemplary embodiments of the present disclosure.

FIG. 10A is a conceptual diagram illustrating a first part of the conventional TMM algorithm to describe the conventional TMM algorithm according to exemplary embodiments of the present disclosure, and FIG. 10B is a conceptual diagram illustrating a second part of the conventional TMM algorithm to describe the conventional TMM algorithm according to exemplary embodiments of the present disclosure.

Referring to FIGS. 10A and 10B, the conventional TMM algorithm may include a first part 1010 and a second part 1020. The first part 1010 may include column-wise (CW) sorters and row-wise (RW) sorters. The CW sorters may include $d_c$ q-to-1 sorters, and the RW sorters may include (q−1) $d_c$-to-2 sorters. The second part 1020 may include one (q−1)-to-L sorter, an intrinsic and extrinsic information calculator, and a C2V message generator. As shown in FIGS. 10A and 10B, the conventional TMM algorithm may utilize $d_c$ q-to-1 sorters, (q−1) $d_c$-to-2 sorters, and one (q−1)-to-L sorter.

Figure 11A:
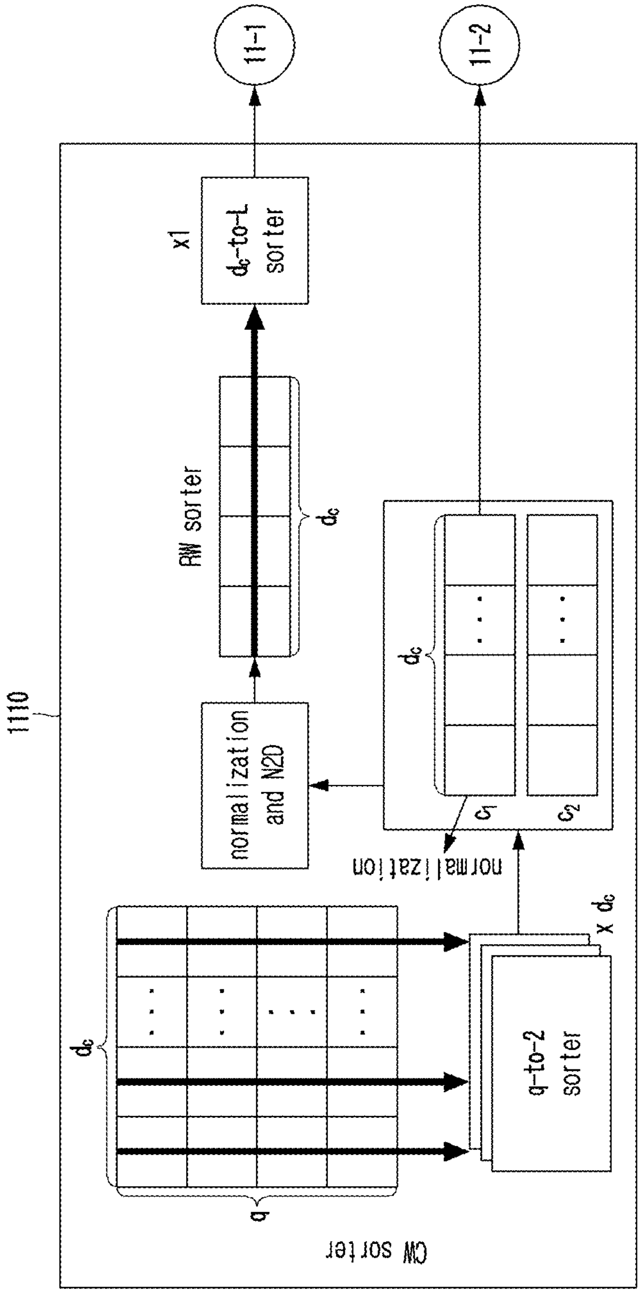
FIG. 11A is a conceptual diagram illustrating a first part of the CW-TMM algorithm to describe the CW-TMM algorithm according to exemplary embodiments of the present disclosure.
Figure 11B:
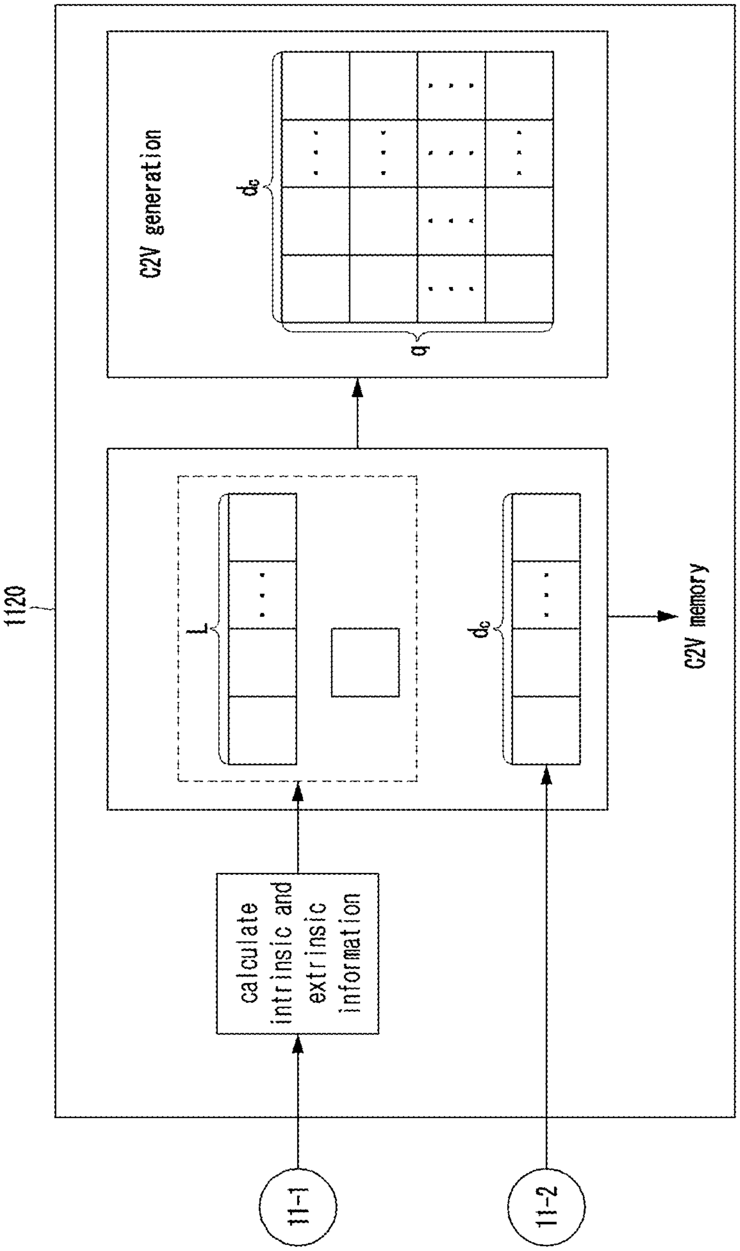
FIG. 11B is a conceptual diagram illustrating a second part of the CW-TMM algorithm to describe the CW-TMM algorithm according to exemplary embodiments of the present disclosure.

FIG. 11A is a conceptual diagram illustrating a first part of the CW-TMM algorithm to describe the CW-TMM algorithm according to exemplary embodiments of the present disclosure, and FIG. 11B is a conceptual diagram illustrating a second part of the CW-TMM algorithm to describe the CW-TMM algorithm according to exemplary embodiments of the present disclosure.

Referring to FIGS. 11A and 11B, the CW-TMM algorithm may include a first part 1110 and a second part 1120. The first part 1110 may include CW sorters and RW sorters. The CW sorters may include $d_c$ q-to-2 sorters, and the RW sorters may include one $d_c$-to-L sorter. As shown in FIGS. 11A and 11B, the CW-TMM algorithm may utilize $d_c$ q-to-2 sorters and one $d_c$-to-L sorter.

In the CW-TMM algorithm, at the beginning of the CNP process, $d_c$ q-to-2 sorters may be used to extract highly reliable data, and subsequent processes may proceed using only the extracted data. The CW-TMM algorithm significantly reduces the usage of the RW sorters compared to the conventional TMM algorithm. In the CW-TMM algorithm, the first minimum value $c_1$ serves to normalize the input messages, similarly to the conventional TMM algorithm. The second minimum value $c_2$ is input to the L-minima sorter and used to calculate intrinsic and extrinsic information. The intrinsic and extrinsic information is expanded to generate output C2V message(s).

Next, the complexity of the sorters in the conventional TMM algorithm and the CW-TMM algorithm will be compared. The complexity of the sorters in these algorithms may be compared as shown in FIG. 12.

Figure 12:
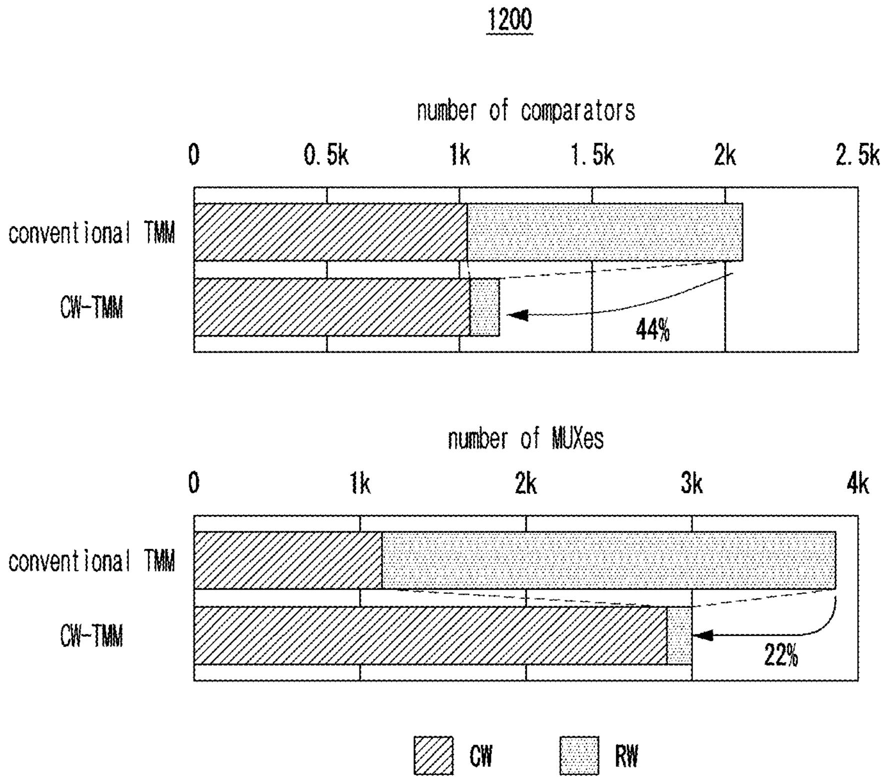
FIG. 12 is a conceptual diagram illustrating complexity comparison of sorters between the conventional TMM algorithm and the CW-TMM algorithm according to exemplary embodiments of the present disclosure.

FIG. 12 is a conceptual diagram illustrating complexity comparison of sorters between the conventional TMM algorithm and the CW-TMM algorithm according to exemplary embodiments of the present disclosure.

Referring to FIG. 12, complexity 1200 of the sorters in the conventional TMM algorithm and the CW-TMM algorithm may be compared in terms of the number of comparators and MUXes. The CW-TMM algorithm significantly reduces the usage of the RW sorter compared to the conventional TMM algorithm. It reduces the number of comparators by approximately 44% and the number of MUXes by approximately 22%.

Next, a message compression technique for reducing memory usage and additional sorter complexity reductions in the CW-TMM algorithm will be described. The message compression method in the CW-TMM algorithm may be represented as shown in FIG. 13.

Figure 13:
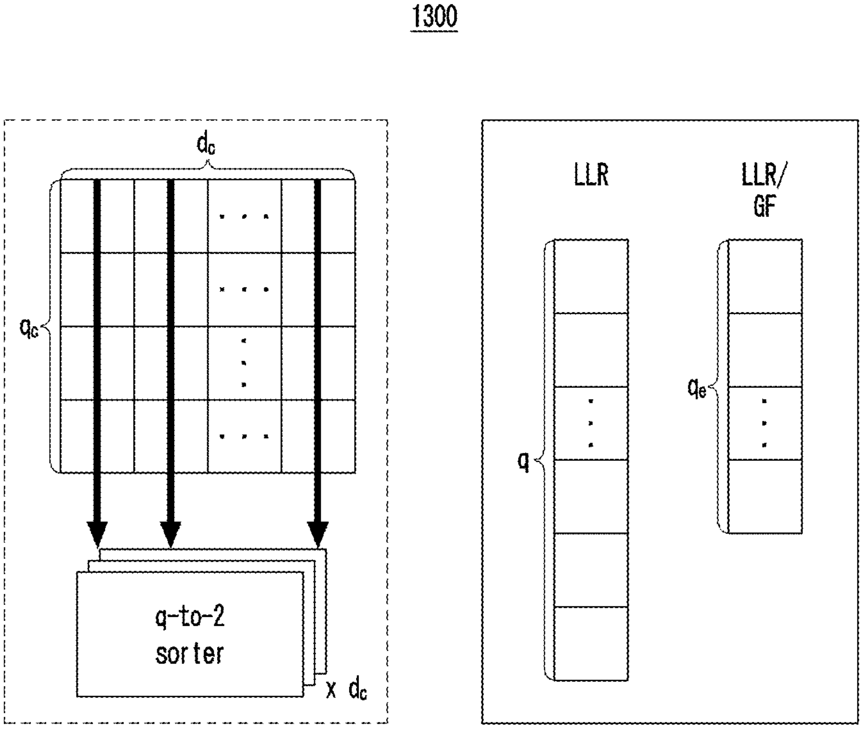
FIG. 13 is a conceptual diagram illustrating a message compression method in the CW-TMM algorithm according to exemplary embodiments of the present disclosure.

FIG. 13 is a conceptual diagram illustrating a message compression method in the CW-TMM algorithm according to exemplary embodiments of the present disclosure.

Referring to FIG. 13, a message compression method 1300 in the CW-TMM algorithm may include $d_c$ $q_e$-to-2 sorters. In the conventional TMM algorithm, each of V2C message(s) and C2V message(s) may include q log-likelihood ratio (LLR) values. In the CW-TMM algorithm, the message compression method 1300 may select $q_e$ highly reliable values from each of V2C message(s) and C2V message(s), and each of V2C message(s) and C2V message(s) may include $q_e$ LLR values. Here, $q_e$ may be a value smaller than q ($q_e<q$). As a result, the CW-TMM algorithm reduces the usage of on-chip memory for storing messages and decreases the number of inputs to the sorters.

Figure 14:
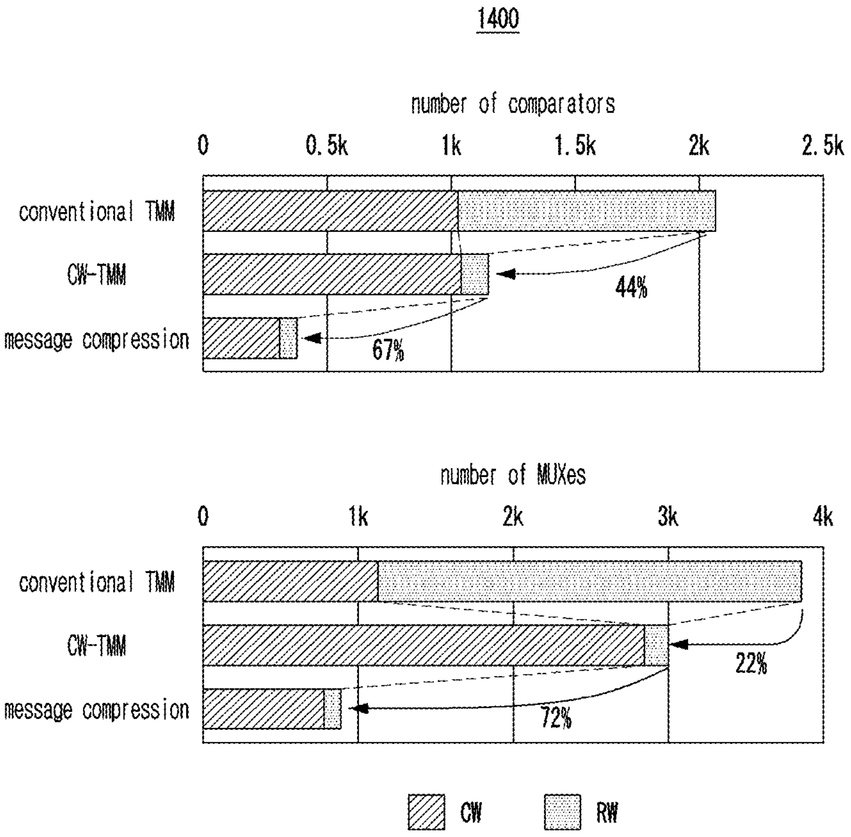
FIG. 14 is a conceptual diagram illustrating comparison of complexity of sorters between the conventional TMM algorithm and the CW-TMM algorithm with a message compression method applied, according to exemplary embodiments of the present disclosure.

FIG. 14 is a conceptual diagram illustrating comparison of complexity of sorters between the conventional TMM algorithm and the CW-TMM algorithm with a message compression method applied, according to exemplary embodiments of the present disclosure.

Referring to FIG. 14, complexity 1400 of the sorters in the conventional TMM algorithm, the CW-TMM algorithm, and the CW-TMM algorithm with a message compression method applied may be compared in terms of the number of comparators and MUXes. The CW-TMM algorithm with the message compression method applied may reduce the number of comparators by approximately 44% and the number of MUXes by approximately 22% compared to the CW-TMM algorithm.

Next, the decoder areas and memory usages of the conventional TMM algorithm and the CW-TMM algorithm will be compared. The decoder areas and memory usages of the conventional TMM algorithm and the CW-TMM algorithm may be compared as shown in FIG. 15.

Figure 15:
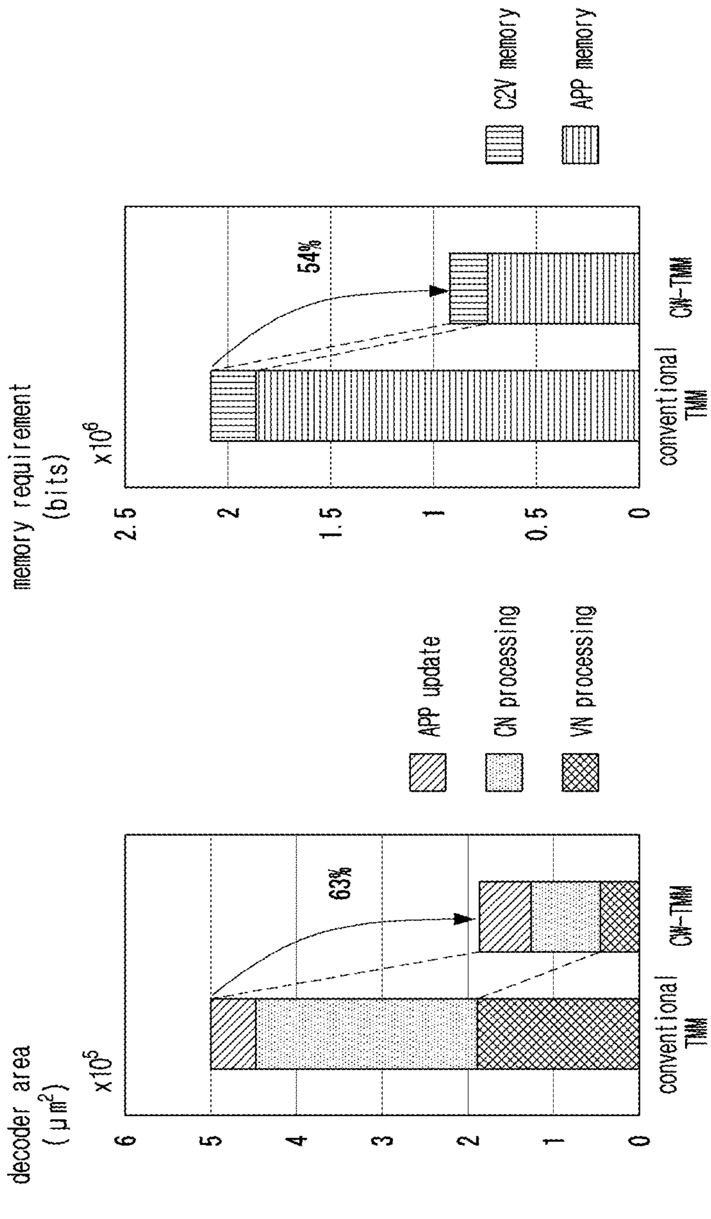
FIG. 15 is a conceptual diagram comparing area complexity and memory usage between the TMM decoder and the CW-TMM decoder according to exemplary embodiments of the present disclosure.

FIG. 15 is a conceptual diagram comparing area complexity and memory usage between the TMM decoder and the CW-TMM decoder according to exemplary embodiments of the present disclosure.

Referring to FIG. 15, the CW-TMM decoder can reduce hardware area by approximately 63% compared to the conventional decoder. Additionally, the CW-TMM decoder can reduce memory usage by approximately 54% through the message compression technique.

Hereinafter, the performance of the conventional TMM decoder and the CW-TMM decoder will be compared. The performance comparison between the conventional TMM decoder and the CW-TMM decoder may be as shown in FIG. 16.

Figure 16:
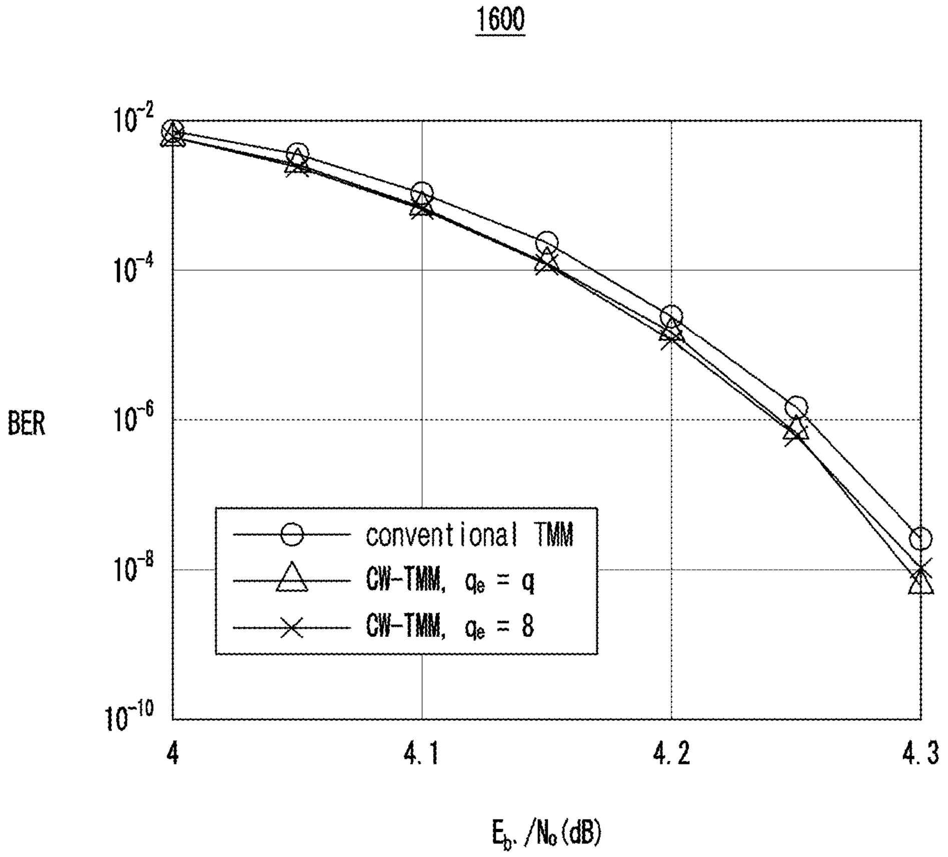
FIG. 16 is a graph illustrating error correction performance comparison between the TMM decoder and the CW-TMM decoder according to exemplary embodiments of the present disclosure.

FIG. 16 is a graph illustrating error correction performance comparison between the TMM decoder and the CW-TMM decoder according to exemplary embodiments of the present disclosure.

Referring to FIG. 16, error correction performance comparison 1600 between the TMM decoder and the CW-TMM decoder includes the performance of the conventional TMM decoder, the first CW-TMM decoder, and the second CW-TMM decoder. The first CW-TMM decoder may not apply the message compression method ($q=q_e$). The second CW-TMM decoder may apply the message compression method with $q_e=8$. It can be confirmed that the second CW-TMM decoder almost maintains the error correction performance of the conventional TMM decoder.

The operations of the method according to the exemplary embodiment of the present disclosure can be implemented as a computer readable program or code in a computer readable recording medium. The computer readable recording medium may include all kinds of recording apparatus for storing data which can be read by a computer system. Furthermore, the computer readable recording medium may store and execute programs or codes which can be distributed in computer systems connected through a network and read through computers in a distributed manner.

The computer readable recording medium may include a hardware apparatus which is specifically configured to store and execute a program command, such as a ROM, RAM or flash memory. The program command may include not only machine language codes created by a compiler, but also high-level language codes which can be executed by a computer using an interpreter.

Although some aspects of the present disclosure have been described in the context of the apparatus, the aspects may indicate the corresponding descriptions according to the method, and the blocks or apparatus may correspond to the steps of the method or the features of the steps. Similarly, the aspects described in the context of the method may be expressed as the features of the corresponding blocks or items or the corresponding apparatus. Some or all of the steps of the method may be executed by (or using) a hardware apparatus such as a microprocessor, a programmable computer or an electronic circuit. In some embodiments, one or more of the most important steps of the method may be executed by such an apparatus.

In some exemplary embodiments, a programmable logic device such as a field-programmable gate array may be used to perform some or all of functions of the methods described herein. In some exemplary embodiments, the field-programmable gate array may be operated with a microprocessor to perform one of the methods described herein. In general, the methods are preferably performed by a certain hardware device.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A method of a first communication node, comprising:

storing a compressed channel message in an a posteriori probability (APP) memory, based on a signal received from a second communication node;

generating a first variable-to-check (V2C) message using a first APP message and a first check-to-variable (C2V) message respectively obtained from the APP memory and a C2V memory, in a variable node processing (VNP) process;

obtaining a first minimum vector and a second minimum vector by performing column-wise (CW) sorting on the first V2C message, in a check node processing (CNP) process, wherein each of the first minimum vector and the second minimum vector includes a plurality of minimum elements extracted from the first V2C message together with corresponding column indices;

generating a second V2C message by performing normalization on the first V2C message based on the first minimum vector, in the CNP process;

obtaining a third minimum vector by performing row-wise (RW) sorting on the second minimum vector based on the first minimum vector, in the CNP process, wherein the third minimum vector is generated based on combinations of elements included in the second minimum vector across rows;

generating a second C2V message based on the third minimum vector, in the CNP process; and performing an APP update based on the second V2C message and the second C2V message, in an APP update process.

2. The method according to claim 1, wherein lengths of the first minimum vector and the second minimum vector are a degree of a check node, a length of the third minimum vector is smaller than the degree of the check node, the channel message is an element belonging to a Galois field (GF) whose order is q, which is a nonbinary finite field, the channel message corresponds to a vector of length q, q is a natural number greater than or equal to 2, each of the first APP message, the first C2V message, and the first V2C message corresponds to a vector of length $q_e$, and $q_e$ is a natural number smaller than q.

3. The method according to claim 1, wherein the VNP process, the CNP process, and the APP update process are iteratively performed until non-binary (NB)-low density parity check (LDPC) decoding is completed.

4. The method according to claim 1, wherein the obtaining of the third minimum vector comprises:

performing normalization and normal-to-delta conversion on the second minimum vector based on the first minimum vector; and performing the RW sorting on the converted second minimum vector to obtain the third minimum vector.

5. The method according to claim 1, wherein the generating of the second C2V message comprises:

obtaining intrinsic information and extrinsic information based on the third minimum vector; and performing recovery for the second C2V message using the intrinsic information and the extrinsic information, wherein the intrinsic information and the extrinsic information are stored in the C2V memory.

6. The method according to claim 5, wherein the VNP process comprises:

obtaining the intrinsic information and the extrinsic information from the C2V memory;

generating the first C2V message based on the intrinsic information and the extrinsic information;

obtaining the first APP message from the APP memory; and generating the first V2C message by performing a subtraction operation on the first C2V message and the first APP message.

7. The method according to claim 1, wherein the APP update process comprises:

generating a second APP message based on the second V2C message and the second C2V message;

compressing the second APP message; and storing the compressed second APP message in the APP memory.

8. A first communication node comprising at least one processor, wherein the at least one processor causes the first communication node to perform:

storing a compressed channel message in an a posteriori probability (APP) memory, based on a signal received from a second communication node;

generating a first variable-to-check (V2C) message using a first APP message and a first check-to-variable (C2V) message respectively obtained from the APP memory and a C2V memory, in a variable node processing (VNP) process;

obtaining a first minimum vector and a second minimum vector by performing column-wise (CW) sorting on the first V2C message, in a check node processing (CNP) process, wherein each of the first minimum vector and the second minimum vector includes a plurality of minimum elements extracted from the first V2C message together with corresponding column indices;

generating a second V2C message by performing normalization on the first V2C message based on the first minimum vector, in the CNP process;

obtaining a third minimum vector by performing row-wise (RW) sorting on the second minimum vector based on the first minimum vector, in the CNP process, wherein the third minimum vector is generated based on combinations of elements included in the second minimum vector across rows;

generating a second C2V message based on the third minimum vector, in the CNP process; and performing an APP update based on the second V2C message and the second C2V message, in an APP update process.

9. The first communication node according to claim 8, wherein lengths of the first minimum vector and the second minimum vector are a degree of a check node, a length of the third minimum vector is smaller than the degree of the check node, the channel message is an element belonging to a Galois field (GF) whose order is q, which is a nonbinary finite field, the channel message corresponds to a vector of length q, q is a natural number greater than or equal to 2, each of the first APP message, the first C2V message, and the first V2C message corresponds to a vector of length $q_e$, and $q_e$ is a natural number smaller than q.

10. The first communication node according to claim 8, wherein the VNP process, the CNP process, and the APP update process are iteratively performed until non-binary (NB)-low density parity check (LDPC) decoding is completed.

11. The first communication node according to claim 8, wherein in the obtaining of the third minimum vector, the at least one processor causes the first communication node to perform:

performing normalization and normal-to-delta conversion on the second minimum vector based on the first minimum vector; and performing the RW sorting on the converted second minimum vector to obtain the third minimum vector.

12. The first communication node according to claim 8, wherein in the generating of the second C2V message, the at least one processor causes the first communication node to perform:

obtaining intrinsic information and extrinsic information based on the third minimum vector; and performing recovery for the second C2V message using the intrinsic information and the extrinsic information, wherein the intrinsic information and the extrinsic information are stored in the C2V memory.

13. The first communication node according to claim 12, wherein in the VNP process, the at least one processor causes the first communication node to perform:

obtaining the intrinsic information and the extrinsic information from the C2V memory;

generating the first C2V message based on the intrinsic information and the extrinsic information;

obtaining the first APP message from the APP memory; and generating the first V2C message by performing a subtraction operation on the first C2V message and the first APP message.

14. The first communication node according to claim 8, wherein in the APP update process, the at least one processor causes the first communication node to perform:

generating a second APP message based on the second V2C message and the second C2V message;

compressing the second APP message; and storing the compressed second APP message in the APP memory.

* * * * *